United States Patent

Nagami et al.

[11] Patent Number: 5,293,578
[45] Date of Patent: Mar. 8, 1994

[54] NOISE REDUCING DEVICE

[75] Inventors: Masaaki Nagami, Kobe; Akira Motojima, Akashi; Yoshihiro Kageyama, Kobe, all of Japan

[73] Assignee: Fujitso Ten Limited, Hyogo, Japan

[21] Appl. No.: 908,571

[22] Filed: Jun. 3, 1992

Related U.S. Application Data

[63] Continuation of Ser. No. 552,516, Jul. 16, 1990, abandoned.

[30] Foreign Application Priority Data

Jul. 19, 1989 [JP] Japan .................. 1-184740

[51] Int. Cl.$^5$ .......................... A61F 11/06; H04R 3/02
[52] U.S. Cl. ..................................... 381/71; 381/73.1
[58] Field of Search .................. 381/13, 71, 73.1, 83, 381/93, 94

[56] References Cited

U.S. PATENT DOCUMENTS

| | | | |
|---|---|---|---|
| 4,087,633 | 5/1978 | Fitzwilliam | 381/66 |
| 4,185,168 | 1/1980 | Granpe | 381/93 |
| 4,689,821 | 8/1987 | Salikaddin | 381/71 |
| 4,947,434 | 8/1990 | Ito | 381/71 |
| 4,947,435 | 8/1990 | Taylor | 381/71 |
| 5,018,202 | 5/1991 | Takahashi et al. | 381/71 |

FOREIGN PATENT DOCUMENTS

| | | |
|---|---|---|
| 48-82304 | 11/1973 | Japan . |
| 62-117213 | 7/1987 | Japan . |
| 63-118320 | 7/1988 | Japan . |
| 63-190511 | 12/1988 | Japan . |
| 63-190512 | 12/1988 | Japan . |
| 63-190513 | 12/1988 | Japan . |
| 64-22814 | 2/1989 | Japan . |
| 64-22815 | 2/1989 | Japan . |

OTHER PUBLICATIONS

IBM Technical Disclosure Bulletin Audible Noise Suppression Jan. 1989.

*Primary Examiner*—James L. Dwyer
*Assistant Examiner*—Jack Chiang
*Attorney, Agent, or Firm*—Oliff & Berridge

[57] ABSTRACT

A noise reducing device including a noise silencing device having a delay unit for delaying a phase of the noise wave, an amplifying unit for adjusting a gain of the delayed noise wave, a superposing unit for superposing the delayed noise wave as the noise silencing wave, a frequency selecting unit for selecting at least one frequency with respect to the noise wave, a factor selecting unit for selecting at least one of a delaying factor used for the delaying unit and a gain factor used for the amplifying unit with respect to the selected frequency, and a controlling unit for controlling at least one of the delaying unit and amplifying unit utilizing the selected delaying factor and a gain factor, respectively, whereby a noise silencing wave having the same frequency and amplitude as that of a noise to reduced but having a reverse phase can be easily obtained, and thus efficient noise reduction can be obtained despite variation of the frequency of the noise.

26 Claims, 14 Drawing Sheets

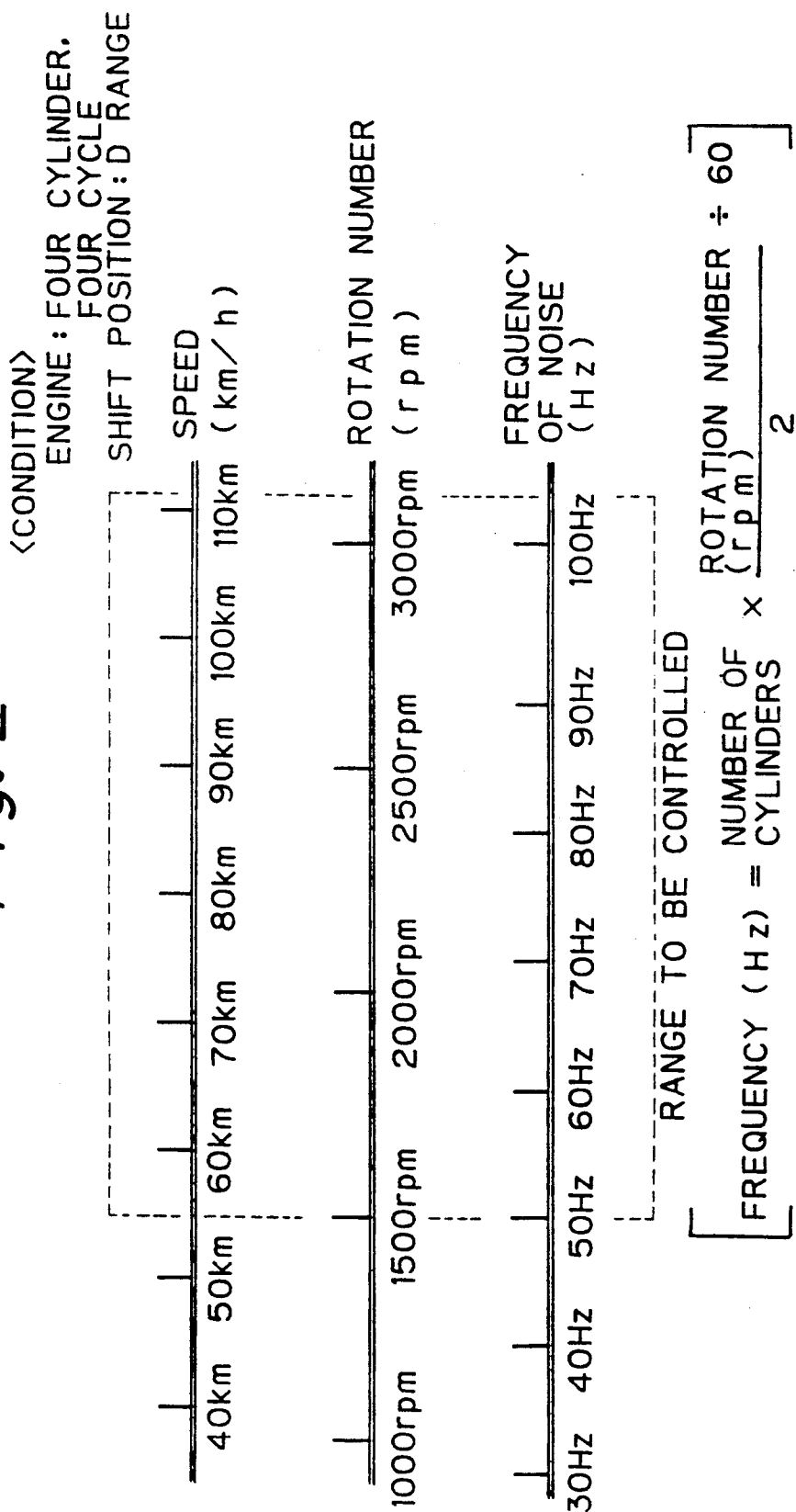

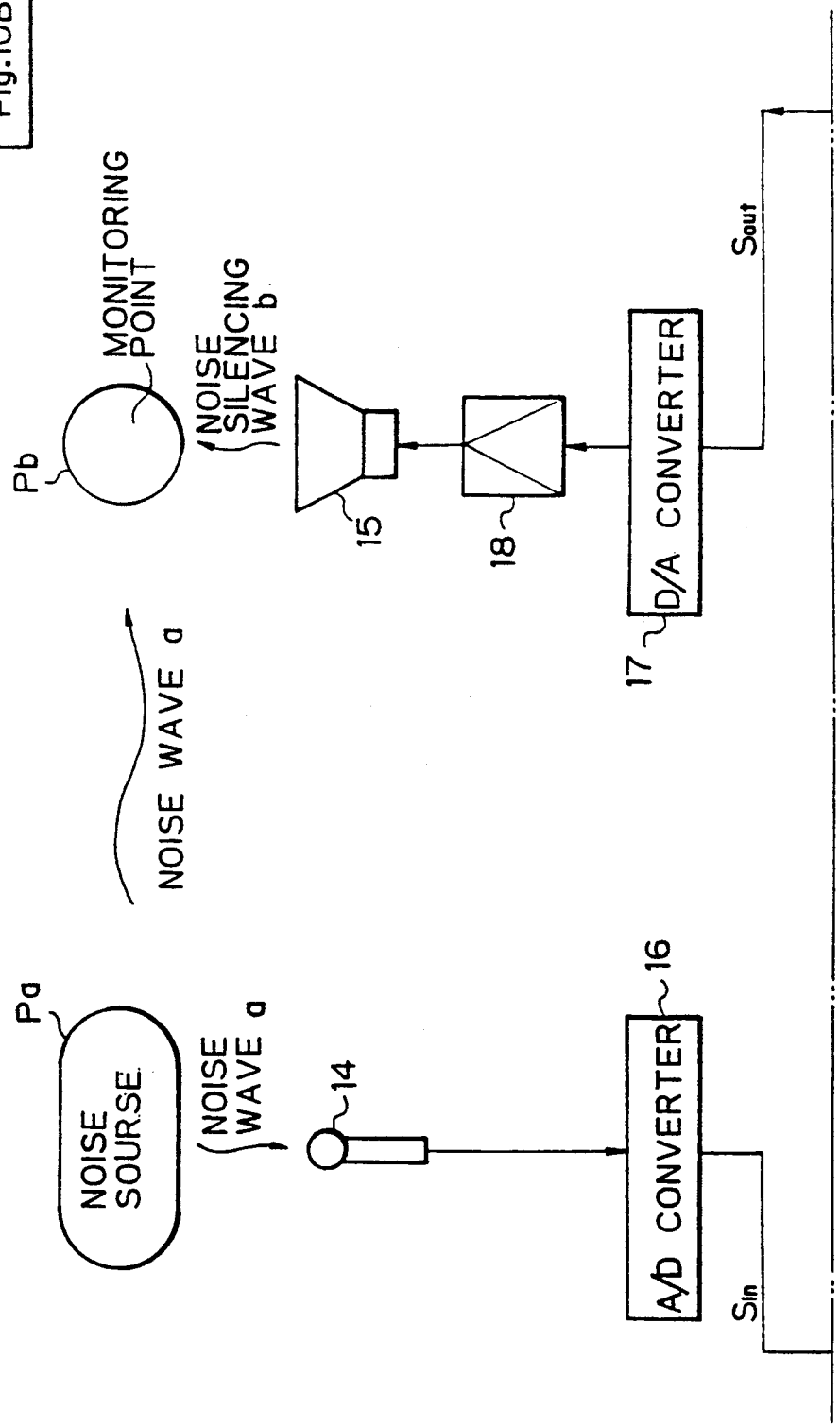

NOISE REDUCING DEVICE

This is a continuation of application Ser. No, 07/552,516, filed Jul. 16, 1990, now abandoned.

BACKGROUND OF THE INVENTION

1. Field of the Invention

This invention relates to a noise reducing device applied to noise generated by a noise source whose level is frequently varied, more particularly to one applied to a noise source such as an engine or muffler in an automobile, fan, or the like.

2. Description of the Related Art

Mufflers, sound insulating materials, sound absorbing materials, and the like are used for reducing noise in houses, factories, vehicle cabins, and the like.

Of particular note are those used in cabins of automobiles, aircraft, trains, and the like.

FIG. 1 shows one example of a conventional noise reducing device, which includes a microphone 14, a delaying means 2 connected to the microphone, a power amplifier 18 connected to the delaying means, and a speaker 15 connected to the power amplifier. When a noise wave a is generated at a noise source point Pa, the noise wave a is converted to an electric signal by the microphone 14. The electric signal is then delayed in the delaying means 2. The power of the delayed signal is amplified at the power amplifier 18 and then converted to actual sound in the speaker 15.

In this device, therefore, sound delayed in a phase from the original noise wave a can be generated from the speaker 15 as a noise silencing wave b. When the noise wave a, generated at a noise source point Pa, reaches a monitoring point Pb, the speaker 15 emits the noise silencing wave b. As this has a reverse phase from the noise wave a at the monitoring point Pb, it erases the noise wave a to reduce the level of the noise.

This kind of noise reducing device works for noise having stable peak frequencies but there are many noise sources which generate noise having variable peak frequencies, for example, an internal combustion engine used in an automobile or a fan used in a gas exhausting duct or the like in which the fan is rotated by an alternating current. The noise reducing device as explained above does not work well for such noise. Many problems arise in dealing with such noise. There problems will be explained with reference to automobiles hereunder, but are not restricted to automobiles.

To reduce the level of noise introduced into a cabin of an automobile, the stiffness of the car body is increased or the sound silencing performance of the muffler is increased. These methods, however, sometimes increases the weight of the car body, reducing the engine performance and increasing production costs. Therefore, a more economical noise reducing means has been required.

The noise reducing device shown in FIG. 1 is economical, but when used for reducing noise in a cabin of an automobile, problems arise. Specifically, in an automobile, noise having a low frequency is usually generated. The noise, i.e., a gas exhaust sound, is generated by the pressure variation caused by the exhaust gas periodically output from the engine. The frequency usually varies in accordance with the rotation number of the engine. This is clear from FIG. 2, which shows general relationship among a speed of an automobile, a rotation number of an engine, and a frequency of noise generated from the engine. It is difficult to form a noise silencing wave b having a reverse phase from the original noise wave a when the frequency of the noise wave a introduced inside the cabin, varies in accordance with the rotation number of the engine.

Generally speaking, the sound frequency level which can be caught by the human ear, is from 50 Hz to 5 kHz. As shown in FIG. 2, the noise generated from an engine of an automobile usually has a frequency of 50 Hz to 100 Hz. Therefore, this noise should be removed to make the cabin environment more comfortable.

On the other hand, when the noise generated from an engine is analyzed, it can be understood that the noise has a peak level at a frequency of around 100 Hz with several higher harmonic waves, as shown in FIGS. 3 and 4.

FIG. 3 shows a distribution of noise levels of noise generated from an engine at 2800 rpm, while FIG. 4 shows the same at 3500 rpm. As apparent from these figures, the peak level appears at the frequency of 100.0 Hz at 2800 rpm and of 125.0 Hz at 3500 rpm. This shows that the peak level of the noise varies depending upon the rotation number of the engine. It is most important that this peak level be reduced or erased. As far as the other higher harmonic waves are concerned, they are not so high in level, so do not usually cause strict problems to passengers.

SUMMARY OF THE INVENTION

Accordingly, the object of the present invention is to provide a noise reducing device which can effectively reduce noise of a varying frequency, particularly one for reducing noise introduced into a cabin of an automobile.

To attain the object of the present invention, the present invention provides a noise reducing device in which noise is silenced by super posing on an original noise wave a noise silencing wave having a different phase, including a noise silencing device having a delaying means for delaying a phase of the noise wave, an amplifying means for adjusting a gain of the delayed noise wave, and a means for superposing the delayed noise wave as the noise silencing wave. The noise silencing device further includes a frequency selecting means for selecting at least one frequency with respect to the noise wave, a factor selecting means for selecting at least one of a delaying factor used for the delaying means and a gain factor used for the amplifying means with respect to the selected frequency, and a controlling means for controlling at least one of the delaying means and amplifying means utilizing the selected delaying factor and gain factor, respectively.

According to the present invention, the level of noise having a variable frequency can be reduced or eliminated by detecting a certain level of the noise, generally a peak level thereof, from the noise to be reduced to determine the frequency thereof, creating a noise silencing wave utilizing the information about the frequency, and superposing it on original noise or selecting a frequency corresponding to the peak level from a memory or the like in which several different frequencies are stored, creating the same noise silencing wave utilizing the information about the frequency, and superposing it on the original noise.

BRIEF DESCRIPTION OF THE DRAWINGS

FIG. 2 is a graph explaining the relationship among a car speed, rotation number of an engine, and a noise frequency;

FIG. 9A-1 to 9B-2 show effects of the present invention.

DESCRIPTION OF THE PREFERRED EMBODIMENTS

The noise reducing device of the present invention will be explained hereunder in more detail with reference to the attached drawings.

Figure 5:
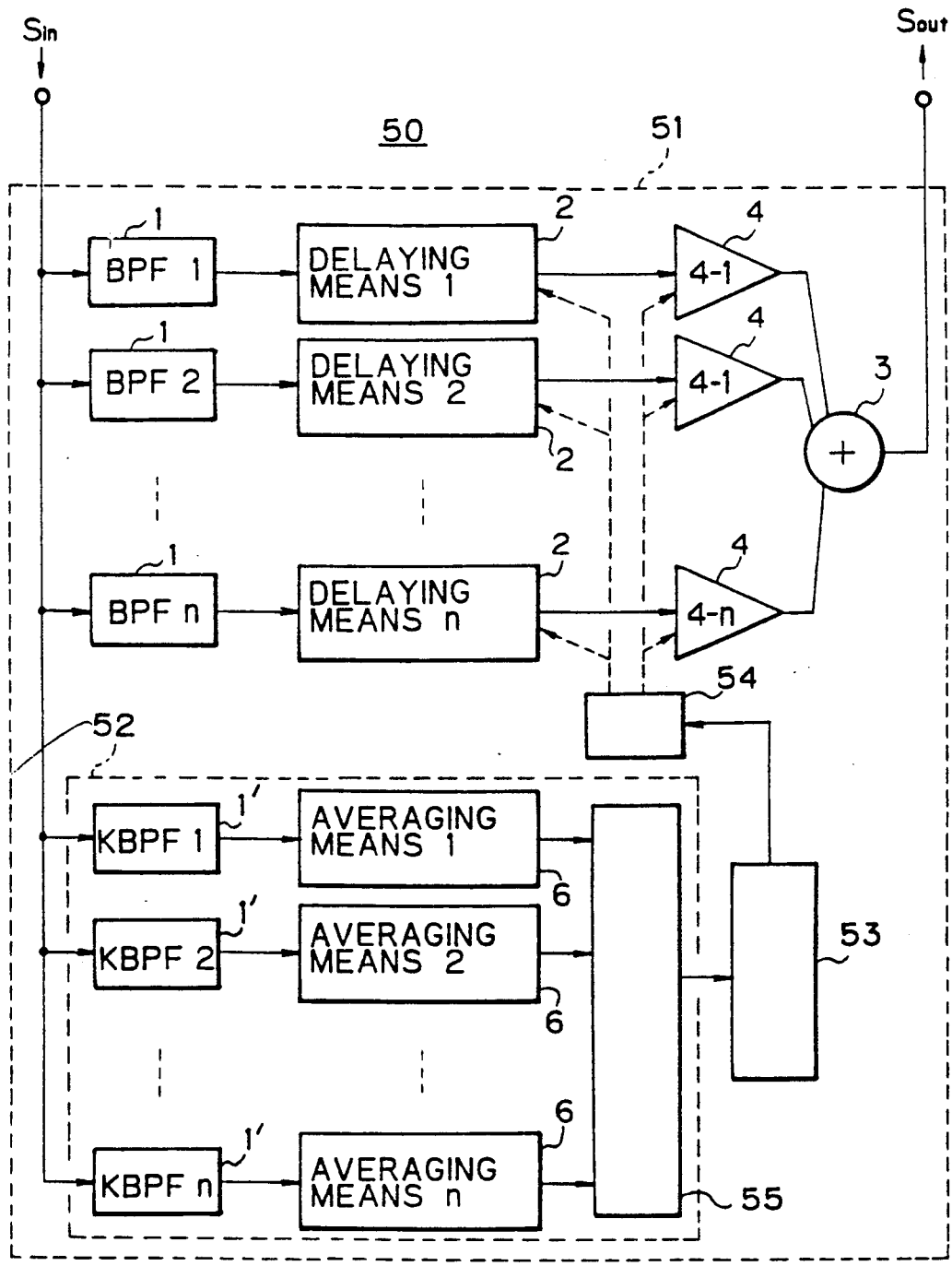
FIG. 5 shows the basic theory and construction of a first aspect of the present invention.

FIG. 5 shows the basic construction and theory of a noise reducing device 50 according to a first aspect of the present invention.

The noise reducing device 50 is based on the same theory for reducing noise as the conventional one explained above, but is provided with a noise silencing device 51 which includes a delaying means 2 for delaying a phase of the noise wave, an amplifying means 4 for adjusting a gain of the delayed noise wave, and a means 15 for superposing the delayed noise wave as the noise silencing wave on the original noise wave. The noise silencing device 51 further includes a frequency selecting means 52 for selecting at least one frequency with respect to the noise wave, a factor selecting means 53 for selecting at least one of a delaying factor used for the delaying means 2 and a gain factor used for the amplifying means 4 with respect to the selected frequency, and a controlling means 54 for controlling at least either one of the delaying means 2 and amplifying means 4 utilizing the selected delaying factor and gain factor, respectively.

In the present invention, it is required to define where the peak level of the noise to be reduced exists, that is, in which frequency level the peak level of the noise exists. To meet this requirement, a plurality of band pass filters 1 (BPF 1 to BPF n) each having a different pass band are provided to separate the noise wave, already converted into a digital signal, into a plurality of frequency bands the noise signals, passing through the band pass filters 1 are processed to form a noise silencing wave having a phase completely reverse to the phase of the original noise and the same amplitude of the original one through the delaying means 2 and the amplifying means 4, which are connected to the band bass filters, utilizing suitable delaying factors and gain factors, respectively. At least one of the noise signals thus processed is output from the noise reducing device 50 through a processor 3, for example, an adding circuit.

In the present invention, all of the separated noise signals may be processed and added to form a noise silencing wave having the same noise level but the reverse phase, although only one of the separated noise signals may be processed to form a noise silencing wave which can eliminate the peak level of the original noise wave.

To this end, only one of the delaying means 2 and the amplifying means 4 connected to a band pass filter (BPFn) which matches the peak level of the original noise wave is actuated. The rest are kept inactive. This selection can be done by a suitable controlling means, for example, a controlling means 54.

In the present invention, the noise silencing wave is basically produced from original noise wave introduced into the noise reducing device 50, but it may be formed from information corresponding to the noise wave to be reduced provided by computer data processing means or the like.

Therefore, according to the first aspect of the present invention, as shown in FIGS. 5 and 10, the noise reducing device 50 is provided with a plurality of band pass filters 1 (BPF 1 to BPF n) as a first band pass filter means each of the band pass filters has a delaying means 2 and amplifying means 4. Further, in the frequency selecting means 52, a plurality of band pass filters 1' (KBPF 1 to KBPF n) are provided as a second band pass filter means. Each of the band pass filters in the second band pass filter means has an averaging means for making an average value of the level of the frequencies in the band pass filter.

The noise reducing device 50 of the present invention is further provided with an analog-to-digital converter 16 for converting the original noise wave a to a digital electric signal $S_{in}$, arranged between the noise wave source Pa and the noise silencing device 51, and a digital-to-analog converter 17 for converting the digitized delayed noise wave, output from the delaying means, to an actual noise signal, arranged between the noise silencing device 51 and the superposing means 15, provided in a space through which the noise wave passes.

The analog-to-digital converter 16 may be a microphone or a combination of a microphone 14 and a suitable A/D converting circuit, while the digital-to-analog converter 17 may be a speaker 15 which also has a function for superposing the noise silencing wave on the original noise wave or a suitable D/A converting circuit In this case, the digital-to-analog converter 17 is connected to the speaker 15 through a suitable power amplifying circuit 18.

In an embodiment of the first aspect of the present invention, there are provided first and the second band pass filter means 1 and 1' which include a plurality of band pass filter BPF 1 to BPF n and KBPF 1 to KBPF n, respectively. Each band pass filter has a different pass band, whereby the electric signal $S_{in}$ converted from an original noise wave introduced into the noise reducing device 50 of the present invention by an A/D converter is separated into a plurality of frequency bands.

The delaying means 2 includes a plurality of delay circuits connected to the band pass filters to delay the separated electric signal.

The amplifying means 4 includes a plurality of amplifying circuits connected to the delay circuits 2 for adjusting the gain of the amplifying means for the delayed signal and also serves as a gate circuit.

A processing means 3 for processing at least a signal output from one of the amplifying circuits to output a noise silencing signal $S_{out}$ is also provided. The processing means 3 of the present invention may consist of an adding circuit, for example, an adder.

In this embodiment, all of the digital signals processed by the band pass filter, the delaying means, and the amplifying means are added at this processor 3 to generate a noise silencing wave $S_{out}$.

As previously explained, in this embodiment, all of the separated noise signals passing through the band pass filters may be added, or only one or part of the separated noise signals may be processed to form the noise silencing wave by only actuating one or part of the amplifying means and delaying means.

The controlling operation for selecting a certain band pass filter or filters is carried out by actuating the required delaying means and/or amplifying means with a controlling signal generated from the controlling means.

On the other hand, the frequency selecting means 53 of this embodiment includes a means for detecting a frequency band of the noise wave in which, for example, a peak level of the noise wave exists. In this embodiment, not only one band pass filter, but also a plurality of the band pass filters may be selected.

Moreover, the detecting means for detecting a frequency having a peak level of the noise wave in the frequency selecting means 52 includes a second band pass filter means comprising a plurality of band pass filters KBPF 1 to KBPF n, having different pass band, whereby the electric signal is separated into a plurality of frequency bands, an averaging means 6 including a plurality of averaging circuits connected to the band pass filters KBPF in the second band pass filter means for making the average output of the band pass filters in the second band pass filter means, a means 55 for discriminating at least one band pass filter in which the highest mean output thereof exists among all of the band pass filters, and a factor controlling means 53 for controlling either a delaying factor or a gain factor of at least one of the amplifying circuits in the amplifying means and the delaying circuit connected to a band pass filter corresponding to the band pass filter in the second band bass filter means in which the mean output thereof shows the highest peak level.

In this embodiment, the factors such as the delaying factor and the gain factor are selected from a memory circuit, in which a plurality of the factors are previously stored, in response to the information obtained by the frequency selecting means to form a suitable noise silencing wave having the same frequency and amplitude but having a phase completely reversed to that of the original noise wave, in order to cancel at least the noise signal having the peak level.

Such data related to those factors may be obtained previously through suitable experiments and stored in a memory or the like.

In this embodiment, the delaying factor of each delaying circuit 2 is set at the predetermined value with respect to the level of the frequency of the band pass filter to which the delaying circuit is connected, while the value of the gain factor applied to the amplifying circuit 4 is varied the varied gain factor is selected from the factor selecting means 53.

Further, in this embodiment, the controlling means 54 can transfer the factor to any one of the delaying circuit and the amplifying circuit and activate or deactivate any one of the delaying circuit and the amplifying circuit in accordance with information output from the frequency selecting means 55.

In this embodiment, the same band pass filters may be used simultaneously both in the first and the second band pass filter means. In this case, an output from one band pass filter in the first band pass filter means is input to the delaying circuit 2 and the average means 6 simultaneously.

Figure 10B:
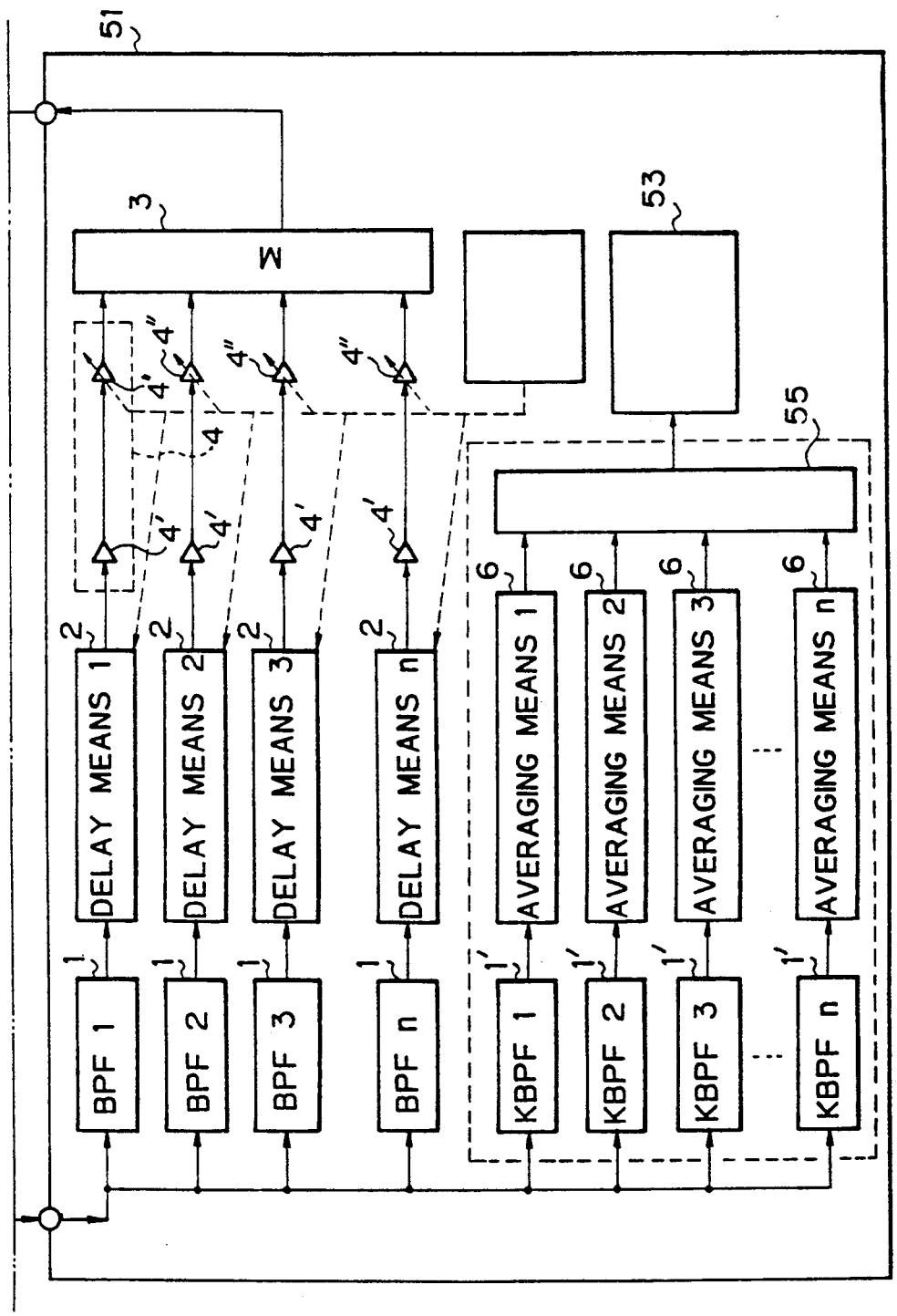
FIG. 10 is a key to reconstruction for FIGS. 10A and 10B which when combined show one embodiment of the first aspect of the present invention.

FIGS. 10A-10B show a more specific embodiment of the first aspect of the present invention, wherein the amplifying means 4 includes two different amplifying circuit 4' and 4". The amplifying circuit 4' is a solid amplifying circuit, and the amplifying circuit 4" is an amplifier for mixing control. The gain factor thereof is changed between zero (0) and one (1) with a step-like configuration. Accordingly, the amplifying circuit 4' may also serve as a gate circuit in this embodiment.

In this embodiment, when a peak level of the frequency of the noise wave a to be reduced varies in a range of, for example, 50 to 100 Hz, 25 band pass filters (BPF) each having a band pass width of 2 Hz may be used in the first and the second band pass filter means 1 and 1'.

The noise silencing wave b is emitted from the overlapping means 15, for example, a speaker, is superposed on the original noise wave a at a monitoring point Pb, whereby the peak level noise can be canceled.

The amount of the delaying factor of each delaying circuit $t_1, t_2, t_3, \ldots t_n$ and the amount of the gain factor of each amplifying circuit $G_1, G_2, G_3, \ldots G_n$ can be obtained by using a dummy noise wave at the noise wave source Pa and trying to cancel it at the monitoring point Pb by superposing a noise silencing wave b generated from the noise reducing device of the present invention, with the two factors adjusted to reduce the dummy noise.

When the frequency of the noise wave a is varied, one of the band pass filters can provide a suitable noise silencing wave b having an amount of delay $t_i$ and an amount of gain $G_i$ sufficient to cancel the noise wave a.

Further in this embodiment, it is preferable that each of the band pass filters (BPF 1, BPF 2, BPF 3 ... BPF n) provided in the first band pass filter means 1 and each counterpart (KBPF 1, KBPF 2, KBPF 3 ... KBPF n) of the first band pass filter means 1 in the second band pass filter means 1' has the same central frequency but a different Q value (steepness). The Q value of the band pass filter, in the second band pass filter means 1'is preferably set at higher level than that of the band pass filters, in the first band pass filter means 1.

The operation of the noise reducing device of this embodiment will be explained hereunder.

A digital signal $S_{in}$ converted from noise to be reduced passes through the band pass filter means 1 including the delaying means 2 and amplifying means 4 and simultaneously passes through the band pass filter means 1' including a plurality of band pass filters KBPF 1 to KBPF n, each having different pass bands and having a higher Q value than that of the band pass filter means 1. By this, the digital signal $S_{in}$ is separated into a plurality of frequency bands.

Then, the average level of the frequencies of the separated signals $S_{in}$ is detected by processing the plurality of levels of noise in the separated signals having one of a positive value and a negative value, converting these signal values into absolute values, utilizing an averaging means 6. Afterward, the signal thus processed is output to a frequency selecting means 55 for selecting a frequency having the maximum sound level, out of any of the sound levels belonging to the frequency bands.

In the frequency selecting means 55, at least one frequency band in which the highest sound level exist is selected. The information output therefrom is transferred to a parameter memory means 9. At least one of gain factors stored therein and/or at least one of delaying factors stored therein is selected in accordance with the information to control one of the delaying means 2 and the amplifying means 4.

In this case, a gain G' of at least one amplifying circuit 4, corresponding to the frequency band in which the highest noise level exists is set at One (G'imax=1), while the gains G' of the rest of the amplifying circuit 4' are set at zero (G'i (i=imax)=0), to control the mixing of the sound signal corresponding to each frequency band.

To make such control easy, in this embodiment, the amplifying circuit 4 may be constructed with an amplifying circuit having a gain factor variable between zero and a predetermined value with a step-like configuration instead of the amplifying circuit as mentioned above consisting of two different kinds of amplifying circuits 4' and 4".

The reason for using mixing controlling technology for mixing a plurality of sound signals in the frequency bands in this embodiment is to prevent the original noise signal from being deformed when a plurality of signals passing through a shut-down region of band pass filters having a neighboring frequency band are superposed at an adder 3.

Thus, in this embodiment, only the signal belonging to a band pass filter circuit having a frequency band in which the highest level of the noise exists can pass through the noise reducing device. Other signals belonging to the rest of the frequency bands are prevented from passing through the device, so undesired effects caused by signals passing through the shut-down region can be eliminated.

Figure 1:
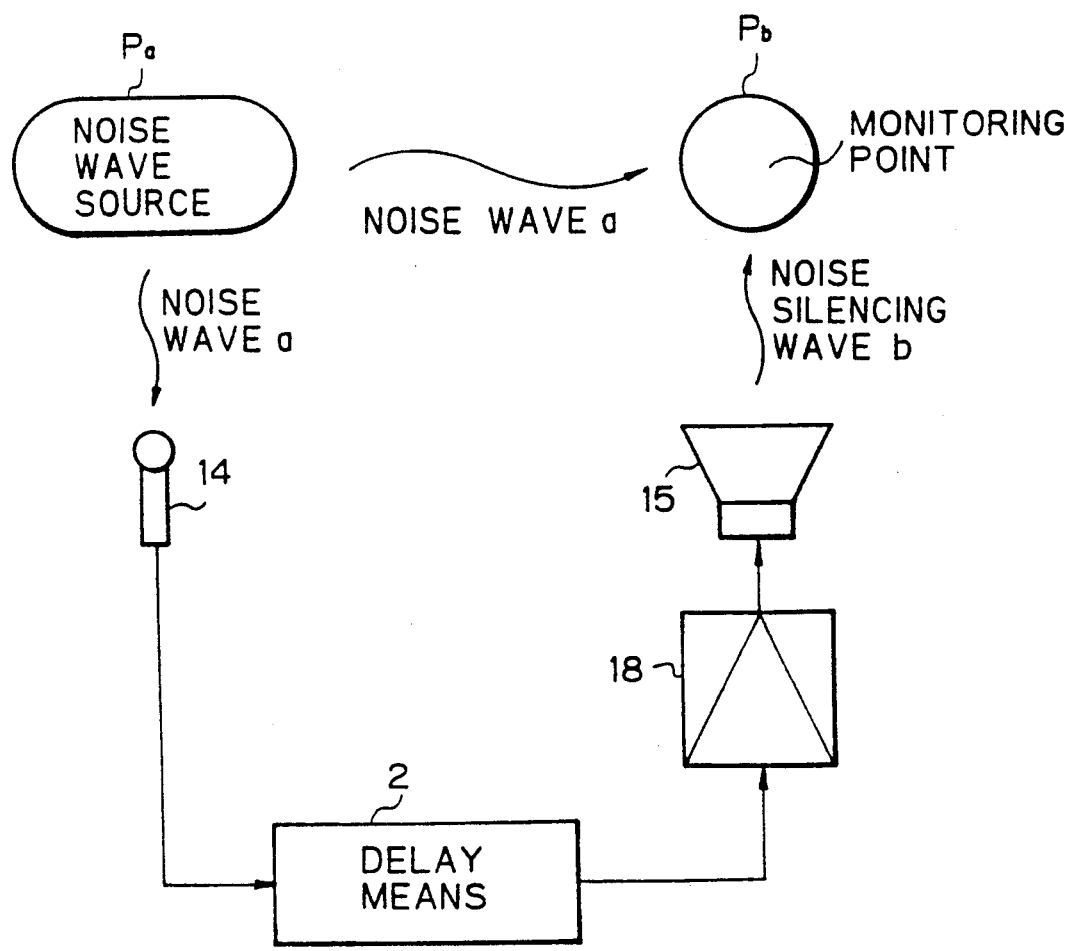
FIG. 1 is an explanatory view of a conventional noise reducing device.
Figure 3:
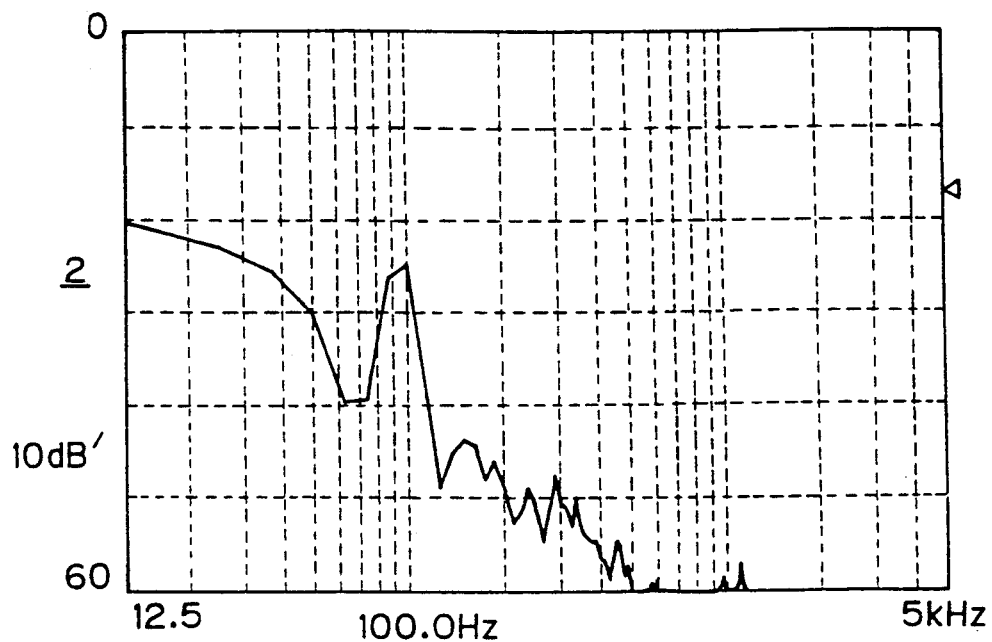
FIGS. 3 and 4 are graphs of a frequency distribution of noise cause by an engine.
Figure 4:
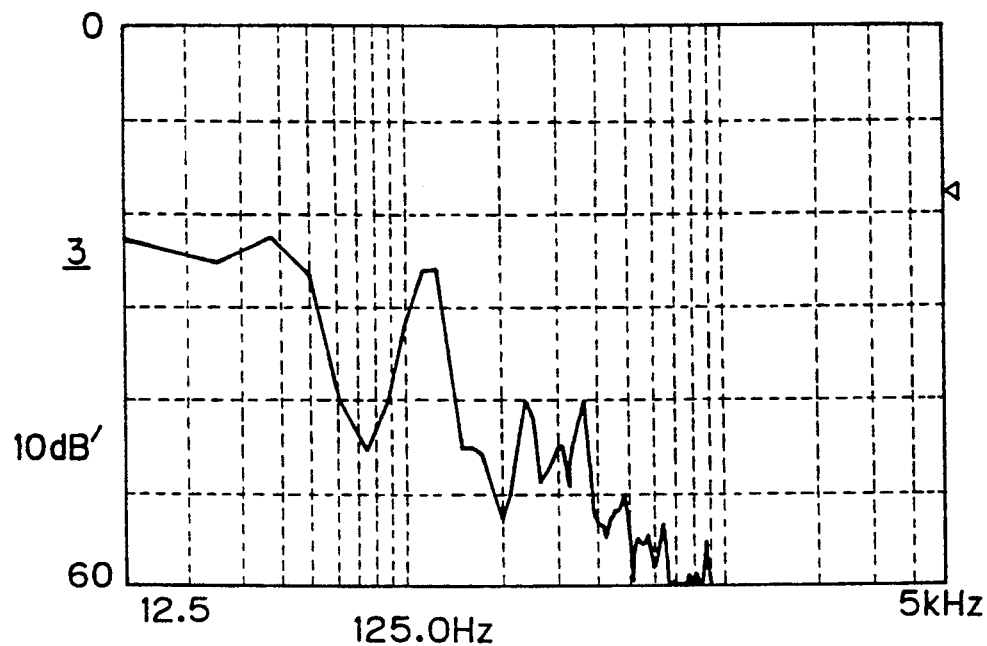
Figures 1, 9A:
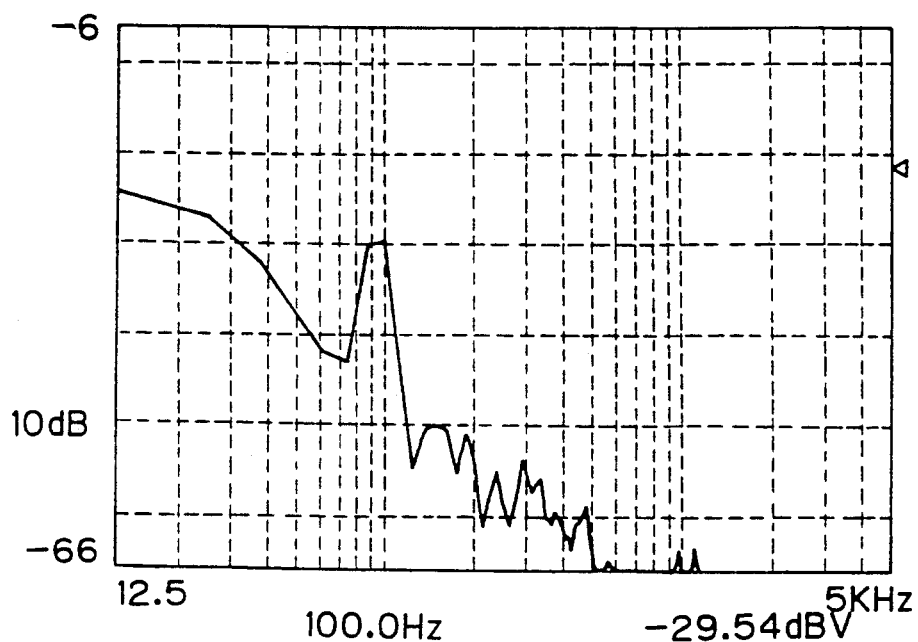
Figures 2, 9A:
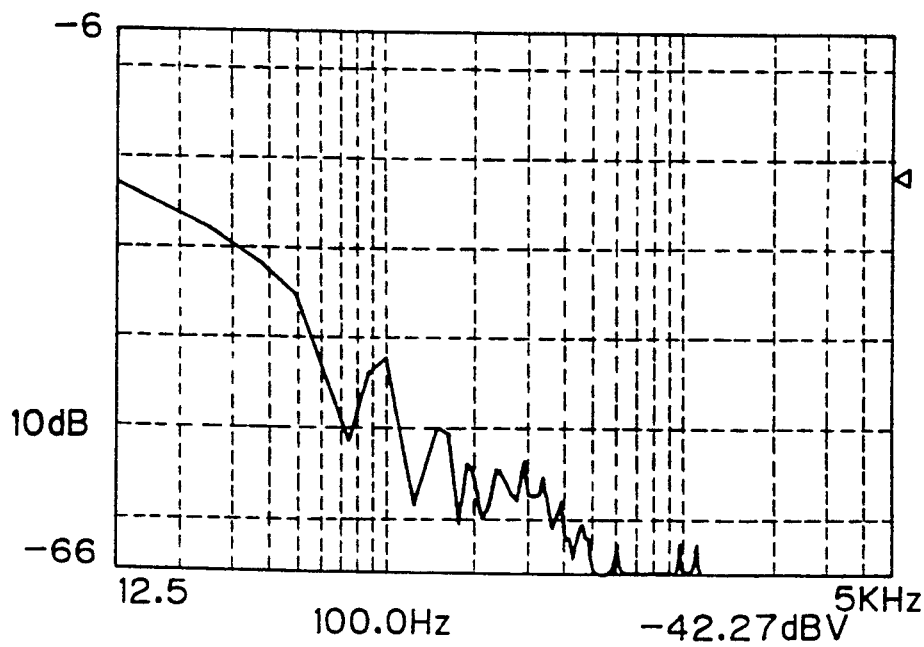
Figures 1, 9B:
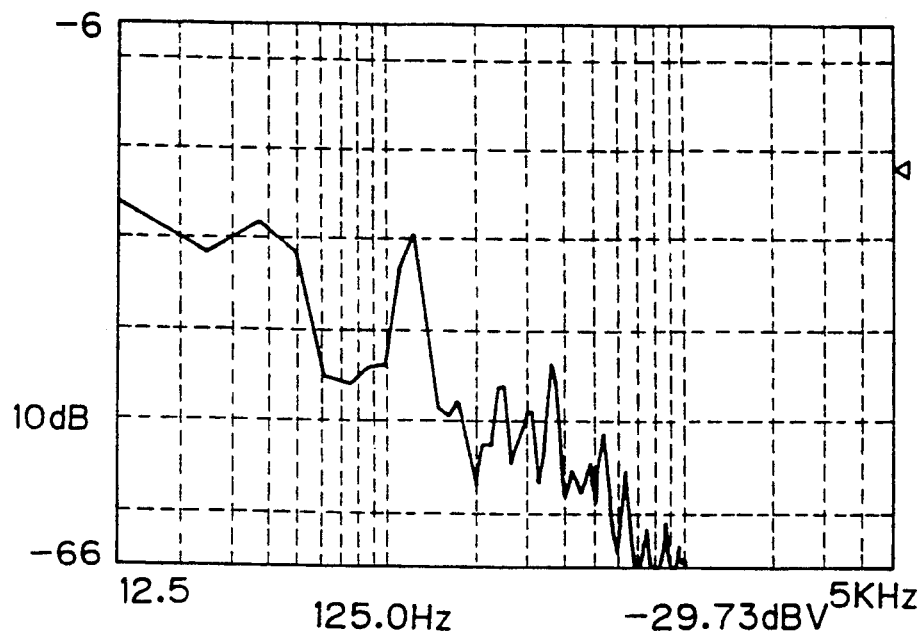
Figures 2, 9B:
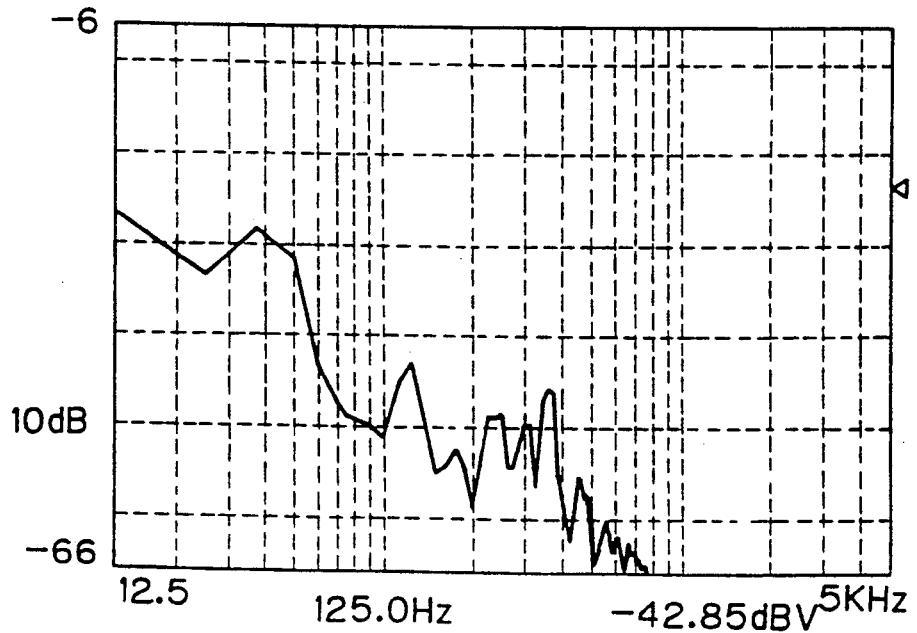

FIGS. 9A and 9B show one of the effects which are obtained by the present invention and FIG. 9A-1 a distribution of noise levels of noise generated from an engine at 2800 rpm in which a peak level of a noise exists at a frequency of 100.0 Hz and FIG. 9B-1 shows the same at 3500 rpm in which a peak level of a noise exists at a frequency of 125.0 Hz, each corresponding to FIG. 3 and 4 respectively.

FIG. 9A-2 shows a distribution of noise levels of a noise obtained by applying the present invention to the noise shown in FIG. 9A-1.

On the other hand, FIG. 9B-2 shows a distribution of noise levels of a noise obtained by applying the present invention to the noise shown in FIG. 9B-1.

In accordance with the results shown by the FIGS. 9A-2 and 9B-2, it is apparent that the peak noise level can be reduced at least by about 14 dB in both case.

In this embodiment, the microphone 14 and the speaker 15 are arranged to be placed apart from each other at a predetermined distance in the same duct through which exhaust gas of the internal combustion engine passes. The distance is decided taking the frequency of the noise wave into account.

In a different case, the microphone 14 may be placed inside the trunk, while the speaker 15 be placed inside the cabin.

In this embodiment, the input electric signal $S_{in}$, which indicates a noise wave with a frequency which varies in accordance with elapsed time, passes through any one of the band pass filter circuits provided in the first band pass filter means 1, is delayed by a delaying means 2 having a predetermined delaying factor, and further amplified by an amplifier 4 having a predetermined gain factor.

The same electric signal $S_{in}$ passes through any one of the band pass filter circuits provided in the second band pass filter means 1' and is averaged by the averaging means 6.

A frequency selecting means 55, a factor selecting means 53, and a controlling means 54 are also provided. These means cooperately work for controlling a gain factor used in the amplifying means 4 increasingly or decreasingly in a step-like configuration in response to the output of information from the averaging circuit 6 indicating the frequency in which the highest level of noise exists.

For example, when one frequency band among the band pass filters is selected in which the highest level of noise is contained, the gain factor of the amplifying means 4 corresponding to the frequency is set at a predetermined value while the gain factors of the rests of amplifying means are set at zero.

Accordingly, only a signal having a frequency band having a maximum amplitude among the input elect signals $S_{in}$ can pass a band pass filter circuit in the first band pass filter means 1 to be delayed and amplified. Thereafter, it is converted through an adder 3 to a noise silencing wave having the same or nearly the same frequency and amplitude as the original noise but having a reverse phase.

As explained above, by adjusting the gain of the amplifying means 4, adverse effects caused by shut-down region formed between adjacent frequency bands in the first band pass filter means 1 can be eliminated.

Figure 6:
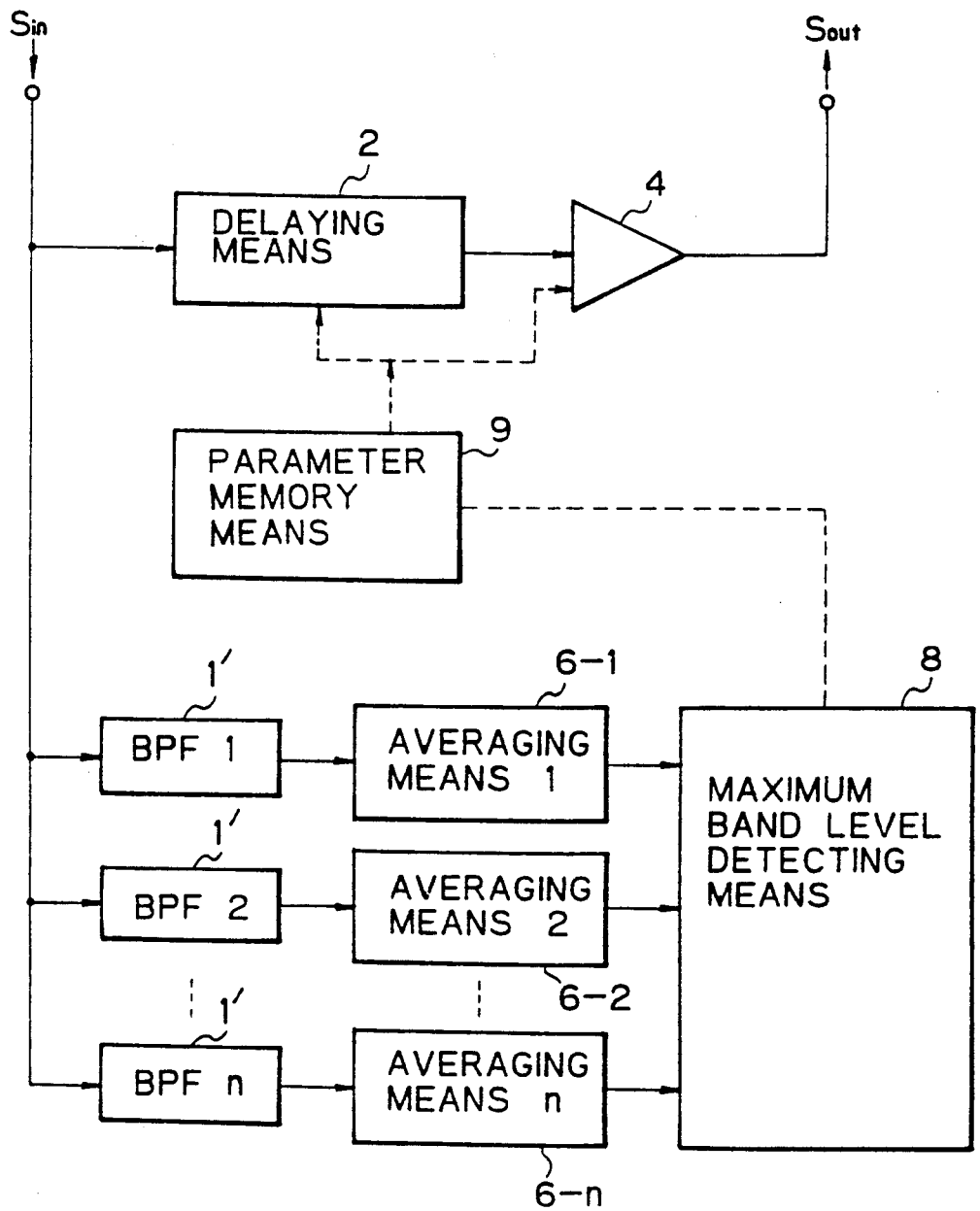
FIG. 6 shows it basic theory and construction of a second aspect of the present invention.
Figure 11:
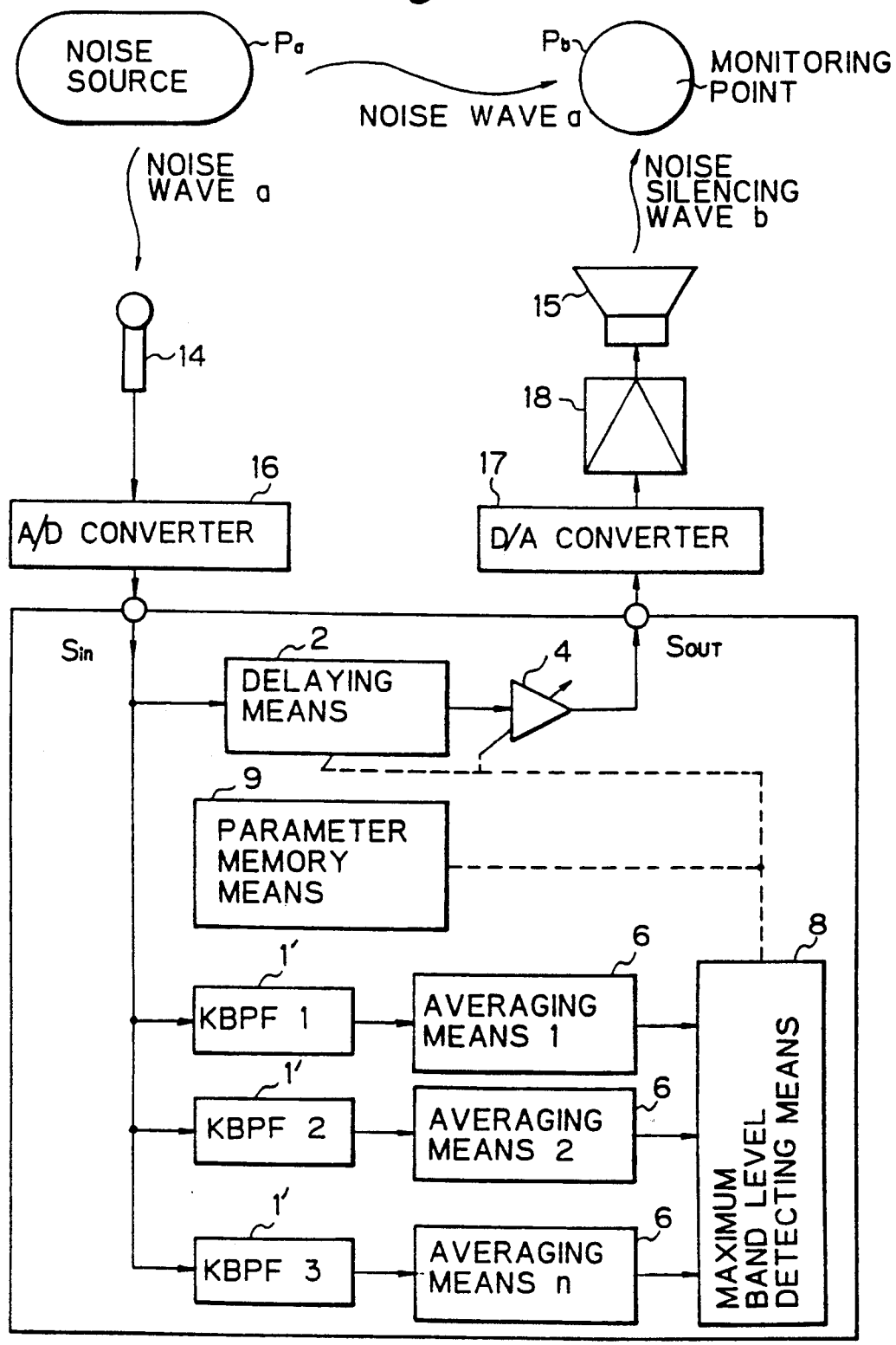
FIG. 11 shows one embodiment of the second aspect of the present invention.

A second aspect of the present invention is explained hereunder with reference to FIGS. 6 and 11.

In the first aspect of the present invention, the noise introduced into the noise reducing device 50 was separated into a plurality of frequency bands and at least one of the frequency bands was selected to form a noise silencing wave. In the second aspect, noise to be reduced introduced into the noise reducing device is not separated. In order to form a noise silencing wave, the noise wave to be reduced is processed with a single delaying circuit 2 or a single amplifying circuit 4 utilizing one of the delaying factor and the gain factor provided from a parameter memory circuit controlled by the frequency selecting means 52.

As apparent from FIG. 6, the delaying means 2 variably delays the electric signal $S_{in}$ converted from the analog noise wave, and the amplifying means 4 variably amplifies the delayed signal to output a noise silencing wave $S_{out}$.

On the other hand, a band pass filter means 1' to provided corresponding to the second band pass filter means, comprising a plurality of band pass filters KBPF 1 to KBPF n, each having different pass bands, whereby the electric signal is separated into a plurality of frequency bands.

An average means 6 is provided which includes a plurality of averaging circuits 6-1 to 6-n connected to the band pass filters KBPF for obtaining the average output of the band pass filters. A discriminating means 8 for discriminating the frequency band having the maximum level is provided to detect at least one frequency band in which the maximum output level exists among all of the averaging circuits and to output it therefrom.

A parameter memory means 9 is provided for storing a plurality of delaying factors and a plurality of gain factors which are previously determined with respect to each frequency. The stored factors are selected respectively in accordance with information output from the discriminating means 8.

An embodiment of the second aspect of the present invention will be explained more specifically with reference to FIG. 11.

In this embodiment, the digital signal $S_{in}$ converted from noise to be reduced passes through a processing circuit including a delaying means 2, comprising only one delaying circuit, and an amplifying means 4, comprising only one amplifying circuit. This processing circuit is not provided with a plurality of band pass filter circuits. Simultaneously, the digital signal $S_{in}$ passes through a band pass filter means 1' including a plurality of band bass filter KBPF 1 to KBPF n, each having different pass bands, whereby the digital signal $S_{in}$ is separated into a plurality of frequency bands each having a different frequency.

Then, the separated signal $S_{in}$ is processed by an averaging means 6 connected to the band pass filter circuit. Afterward, the signal thus processed is output to a discriminating means 8 for discriminating a frequency having a maximum level out of any of the sound levels belonging to each frequency band.

In the discriminating means 8, at least one frequency band in which the highest sound level exists is selected. The information output therefrom is transferred to a parameter memory means 9, and at least one of the gain factors stored therein and/or at least one of delaying factors stored therein is selected in accordance with the information to control one of the delaying means 2 and the amplifying means 4.

In this case, since the parameter memory means 9 stores a set of a plurality of the delaying factors and another set of a plurality of the gain factors, both corresponding to frequency bands of the band pass filter means 1' (ti, Gi; i=1, 2, ... n), at least one of the delaying factors and/or at least one of the gain factors is read out from this memory 9 in response to the output from the discriminating means 8 and corresponding to the data output from the discriminating means 8 in which information indicating the frequency band in which the highest level of the noise exists is determined. The delaying factor and/or the gain factor is set respectively.

In this embodiment, the digital signal can be delayed and amplified in accordance with the frequency utilizing the delaying means 2 and the amplifying means 4, whose delaying factor and gain factor are set as explained above, even when the frequency of the digital signal $S_{in}$ is varied.

A comparison between the first embodiment and the second embodiment shows the second aspect is more economical in that the number of parts used in the band pass filter or the like can be reduced due to the introduction of the parameter memory means.

Figure 7:
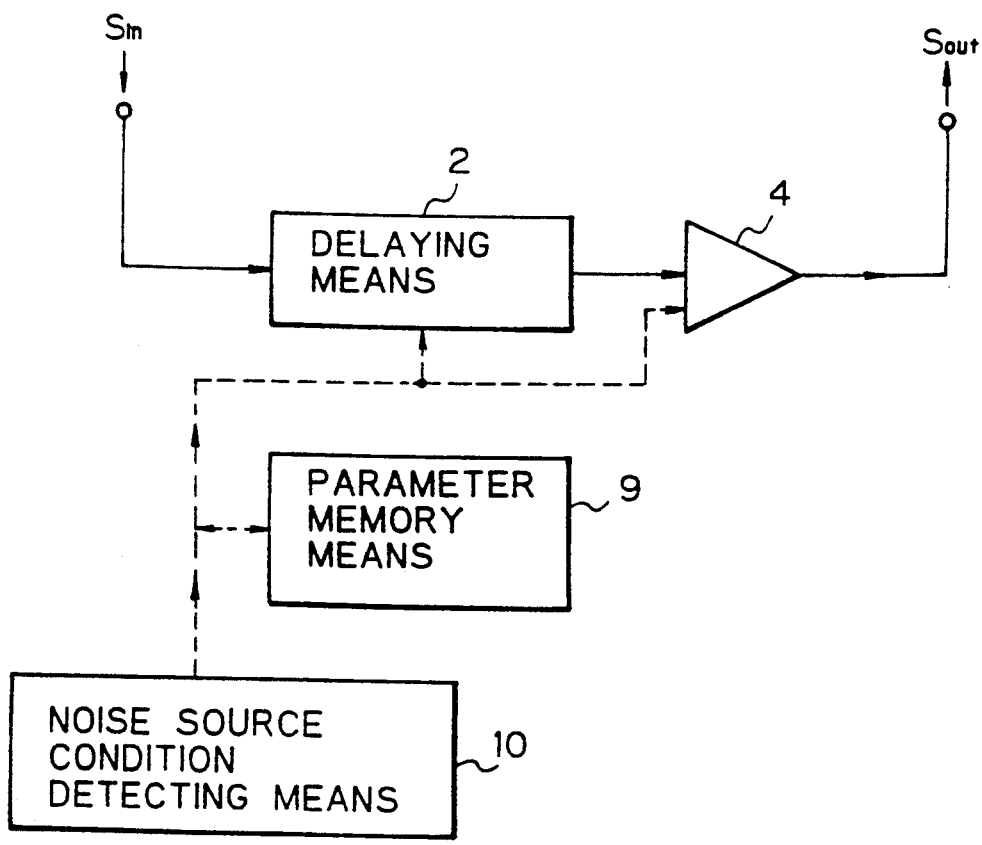
FIG. 7 shows the basic theory and construction of a third aspect of the present invention.

FIG. 7 shows an embodiment of a third aspect of the present invention.

In the previous embodiments as explained above, the delaying factor and/or the gain factor used in the delaying circuit and/or the amplifying means are determined by analyzing a noise wave introduced into the noise reducing device of the present invention. In this embodiment, these factors may be determined by utilizing specifically provided information different from the noise wave.

As apparent from FIG. 7, the delaying means 2 variably delays the phase of an electrical signal $S_{in}$ converted from noise introduced into the noise reducing device against the original phase thereof, while the amplifying means 4 variably amplifies the delayed signal to output a noise silencing wave signal $S_{out}$.

On the other hand, a noise wave source condition detecting means 10 is provided to detect a condition of the noise source and to output a control signal to a parameter memory means 9 to select a suitable delaying factor and/or gain factor to adjust the delaying means 2 and/or the amplifying means 4 to form a noise silencing wave sufficient to cancel the peak level of the noise wave.

Toward this end, the relationship between a certain condition of the noise wave source and the necessary factors used in at least one of the delaying means 2 and the amplifying means 4 is previously observed. In this embodiment, the noise wave source condition detecting means 10 may detect the rotation number of the engine. Thus, the relationship between the rotation number of the engine and these factors should be checked previously.

In this embodiment, the noise wave source condition detecting means 10 may, for example, detect the rotation number of the engine by detecting the crank angle utilizing a crank angle sensor used for detecting ignition timing in the engine and output the resultant information to the parameter memory means 9.

The parameter memory means 9 has the same construction as used in the previous embodiments and stores a plurality of data of the delaying factor and a plurality of data of the gain factor corresponding to each rotation number of the engine.

Accordingly, when information indicating the rotation number of the engine is input to the parameter memory means 9 from the noise wave source condition detecting means 10, a certain delaying factor and/or a certain gain factor are read out therefrom to control at least one of the delaying means 2 and the amplifying means 4.

Figure 12:
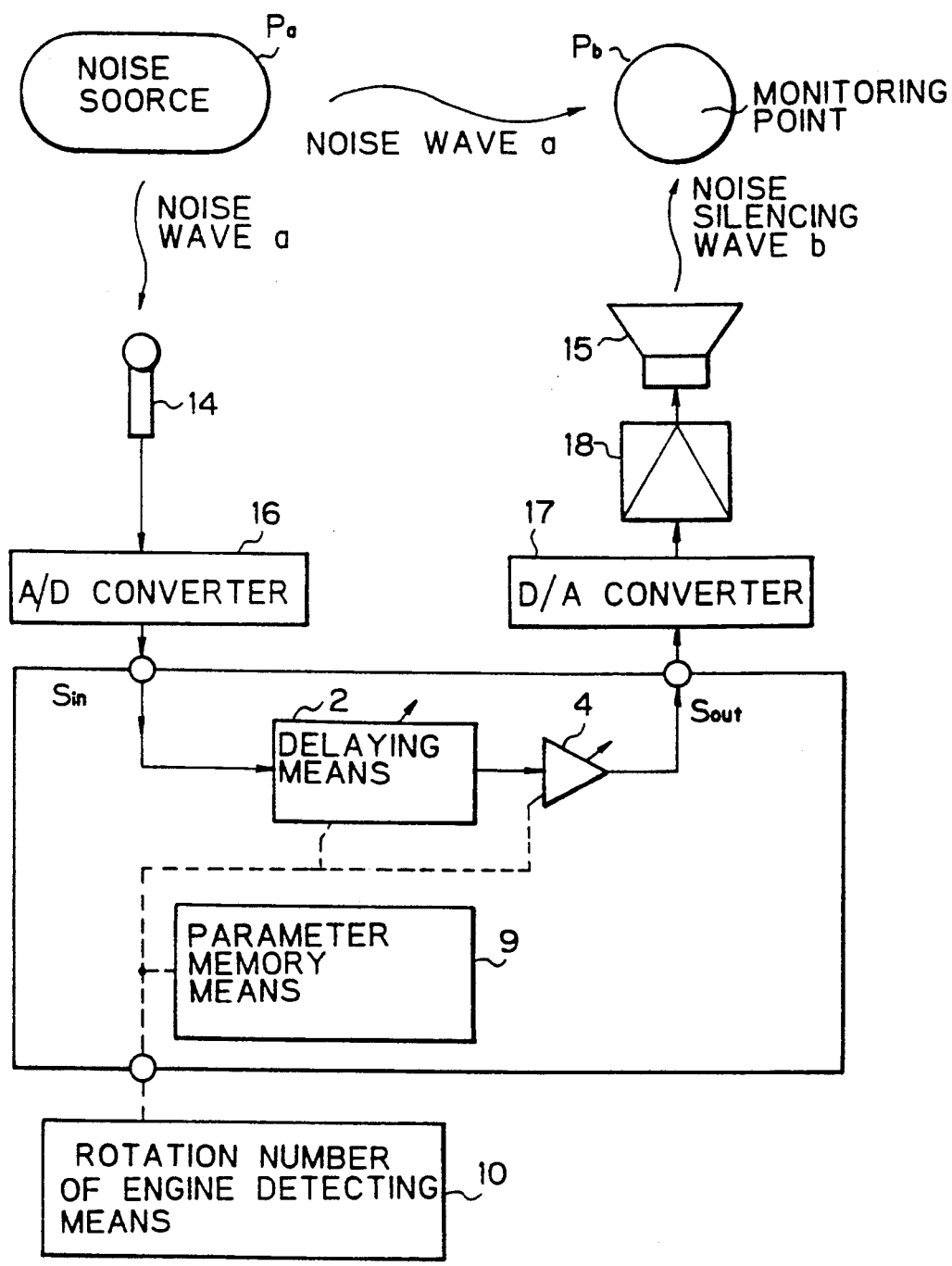
FIG. 12 shows one embodiment of the third aspect of the present invention.

FIG. 12 shows a specific embodiment of the third aspect of the present invention, in which a noise wave a is converted to a digital signal $S_{in}$ through a microphone 14 and an A/D converter 16 and is processed by a delaying means 2 and an amplifying means 4 to form a noise silencing wave $S_{out}$.

The noise silencing wave $S_{out}$ is converted to an analog signal by a D/A converter 17 and emitted from a speaker 15 through a power amplifier 18 to be superposed by the original noise wave a at a monitoring point Pb.

An engine rotation number detecting means, used as a noise wave source condition detecting means 10, detects the rotation number as explained above, for example, and outputs the information to the parameter memory means 9.

Then, at least one of the delaying factor and gain factor corresponding to the rotation number of the engine is output to control one of the delaying means 2 and the amplifying means 4, respectively.

In this embodiment, since an engine rotating number detecting means is provided as a noise wave source condition detecting means 10, into account, the fact that the rotation number of an engine has a close connection to the frequency of the noise wave, advantages over the previous embodiments can be obtained in that the parts used for the band pass filter means can be eliminated.

Figure 8:
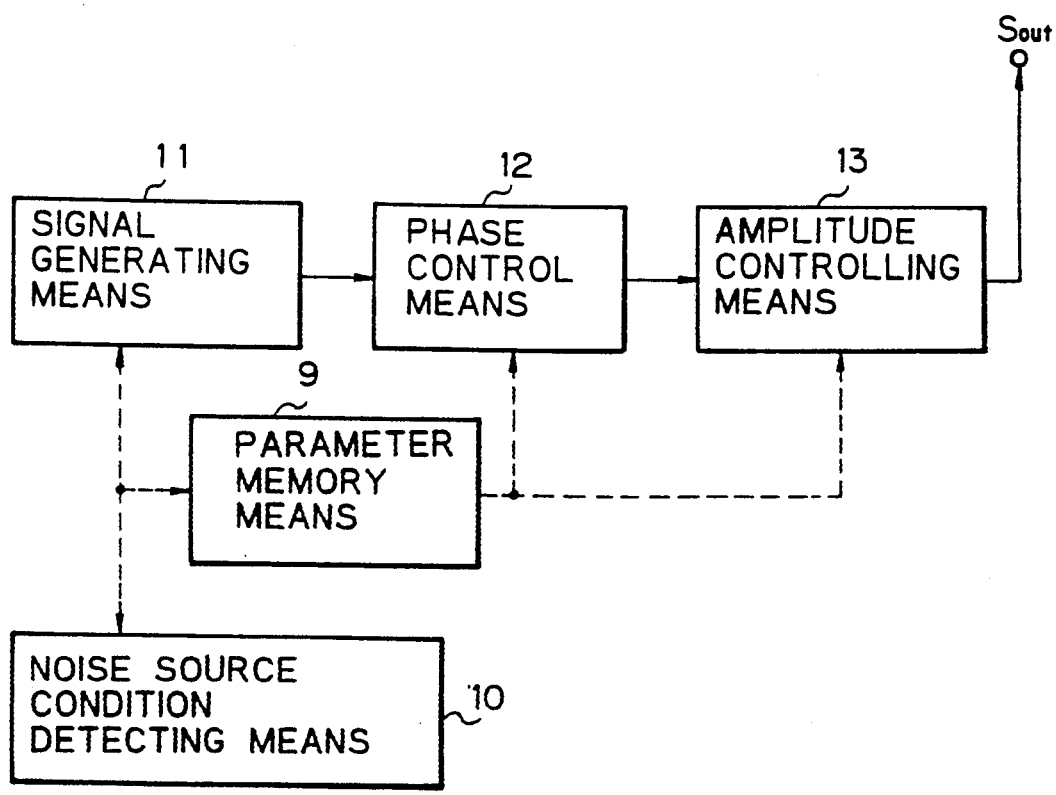
FIG. 8 shows the basic theory and construction of a fourth aspect of the present invention.

FIG. 8 shows a fourth embodiment of the present invention.

In the third embodiment, the noise silencing wave $S_{out}$ is directly formed from a noise wave $S_{in}$ introduced into the noise reducing device of the present invention, but in this embodiment, the noise silencing wave $S_{out}$ is formed from information output from the noise wave source condition detecting means 10.

Note, that the noise wave source condition detecting means 10 used in the third and fourth embodiments serve as the frequency selecting means used in the first embodiment.

As apparent from FIG. 8, a signal generating means 11 is additionally provided over the circuit construction in the third embodiment as shown in FIG. 7. The signal generating means 11 is connected to the noise wave source condition detecting means 10 and the parameter memory means 9.

The signal generating means 11 generates a sine curve signal having a frequency corresponding to the rotation number of the engine output from the noise wave source condition detecting means 10.

Figure 13:
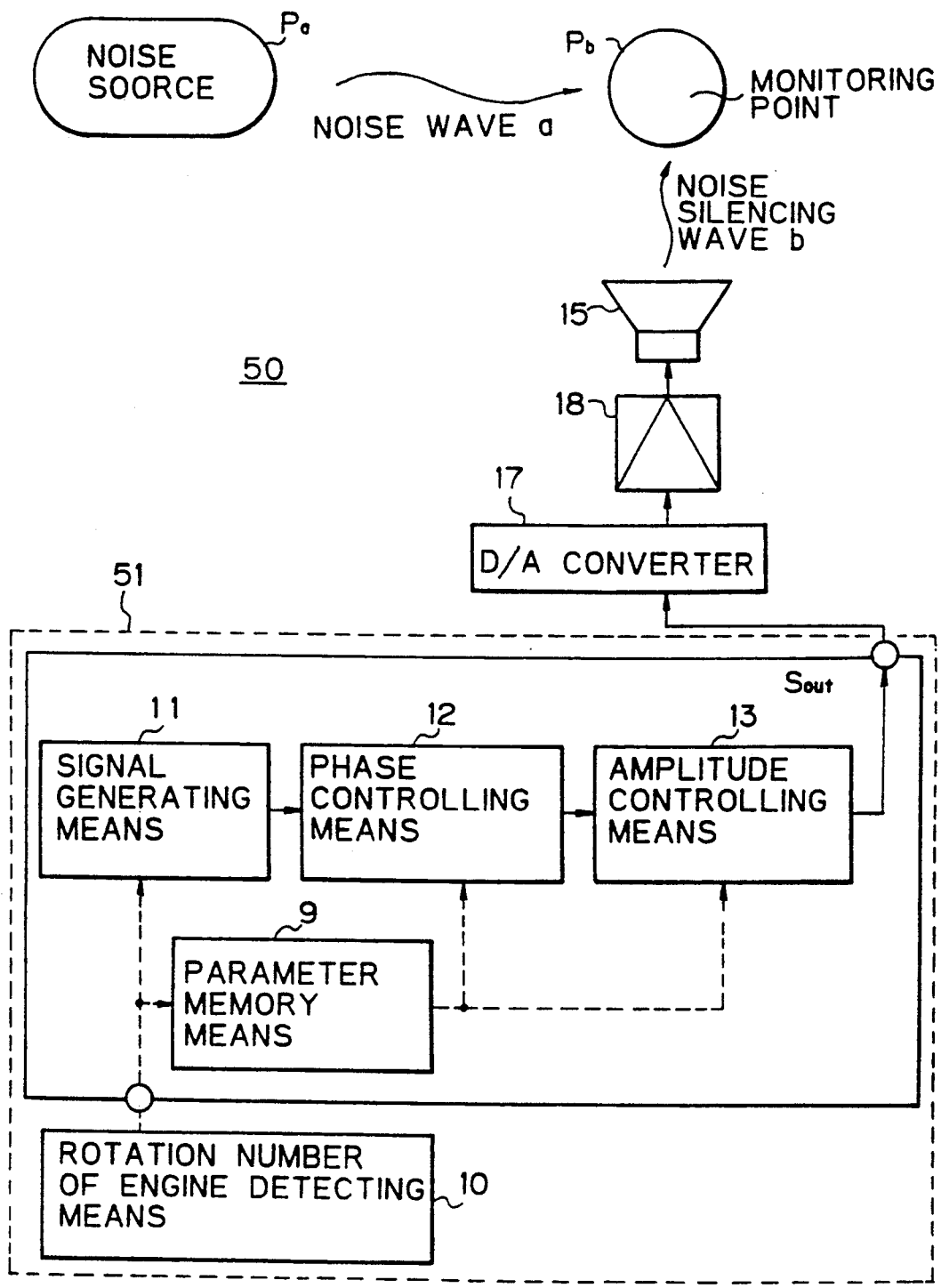
FIG. 13 shows one embodiment of the fourth aspect of the present invention.

FIG. 13 shows a specific embodiment of the fourth aspect of the present invention. Compared with the circuit construction of the third embodiment as shown in FIG. 12, in this embodiment, the microphone 14 and A/D converter 16 are omitted and a signal generating means 11 is provided.

The signal generating means 11 is connected to the noise wave source condition detecting means 10 and the parameter memory means 9 and also connected to a phase adjusting means 12 corresponding to the delaying means 2 used in the previous embodiments and an amplitude adjusting means 13 corresponding to the amplifying means 4 used in the previous embodiments through the phase adjusting means 12.

The noise silencing wave $S_{out}$ output from the amplitude adjusting means 13 is converted to an analog signal by a D/A converter 17 and emitted from a speaker 15 through a power amplifier 18 to be superposed on the original noise wave a at a monitoring point Pb.

The noise wave source condition detecting means 10 and the parameter memory means 9 have the same constructions and functions as in the third embodiment.

In this embodiment, when the noise wave source condition detecting means 10 outputs, for example, the rotation number of the engine in the same manner as explained above, the signal generating means 11 outputs, for example, a sine wave having a frequency corresponding to the rotation number of the engine thus detected.

The time reference of the sine wave can be obtained from ignition timing detected by a crank sensor.

In this embodiment, the output data related to the rotation number of an engine output from the noise wave source condition detecting means 10 is also applied to the parameter memory means 9, and at least one of a phase factor, which is the same as the delaying factor used in the previous embodiments, and a gain factor, corresponding to the detected rotation number of the engine, are selected therefrom and output at least to one of the phase adjusting means 12 and the amplitude adjusting means 13 to control the same.

Thus, the phase adjusting means 12 can delay a phase of the sine wave generated from the signal generating means 11 in accordance with the rotation number of the engine. Thereafter, the amplitude adjusting means 13 outputs the output signal, i.e., noise silencing wave $S_{out}$, by adjusting the amplitude of the delayed sine wave in accordance with the rotation number of the engine.

In this embodiment, since the noise silencing wave signal for cancelling a noise wave is formed in accordance with the rotation number of the engine detected by the noise wave source condition detecting means 10, a plurality of parts, including the microphone, can be omitted compared with the third embodiment.

As explained above, in the present invention, the microphone 14 may be placed inside the trunk and the speaker 15 placed inside the cabin, a noise wave applied to the microphone processed, and a noise silencing wave emitted from the speaker into the cabin. This arrangement is preferable since the microphone 14 is close to the muffler, i.e., the noise wave source. Alternatively, both the microphone and the speaker may be arranged in the cabin, but in this case howling caused by detoured sounds is easily generated.

According to the present invention, a variable frequency of a noise wave can be defined by using a band pass filter means comprising a plurality of band pass filter having different pass bands or a noise wave source condition detecting means such as an engine rotation number detecting means. Further, a noise silencing wave having a phase reverse to that of a noise wave having a specific frequency can be formed by a delaying means, whereby efficient noise reduction can be obtained despise variation of the frequency of the noise.

We claim:

1. A noise reducing device in which noise is silenced by superposing on an original noise wave generated from a noise wave source a noise silencing wave having a different phase from that of said noise wave and generated from a noise silencing device, said noise silencing device comprising:
   a) a frequency selecting means for selecting at least one frequency with respect to said noise wave, said frequency selecting means having
      i) a first and pass filter means comprising a plurality of band pass filters having different pass bands, whereby an electric signal representing said noise wave is separated into a plurality of frequency bands;
      ii) detecting means for detecting a frequency band in which a peak level of said noise wave exists;
   b) a delaying means for delaying a phase of said noise wave, said delaying means comprising a plurality of delay circuits connected to said band pass filters to delay said separated electric signal;
   c) an amplifying means for adjusting a gain of said delayed noise wave, said amplifying means comprising a plurality of amplifying circuits connected to said delay circuits for adjusting the gain to said delayed signal and servicing as a gate circuit;
   d) factor selecting means for selecting at least one of a delaying factor used for said delaying means and a gain factor used for said amplifying means with respect to said selected frequency;
   e) controlling means for controlling at least one of said delaying means and amplifying means utilizing said selected delaying factor and gain factor, respectively;
   f) a processing means for processing at least a signal output from said amplifying circuit to output a noise silencing signal; and g) means for superposing said noise silencing signal on said original noise wave.

2. A noise reducing device according to claim 1, wherein said noise silencing device is further provided with an analog-to-digital converter for converting said original noise to digital electric signal arranged between said noise wave source and said noise silencing device, and a digital-to-analog converter for converting said digitized delayed noise wave output from said delaying means to actual noise signal arranged between said noise silencing device and said superposing means provided in a space through which said noise wave passes.

3. A noise reducing device according to claim 1, wherein said peak level of said original noise wave varies.

4. A noise reducing device according to claim 2, wherein said analog-to-digital converter is a microphone which convert said original noise wave to a digital signal.

5. A noise reducing device according to claim 1, wherein said detecting means for detecting a frequency having a peak level of said noise wave further comprises a second band pass filter means comprising a plurality of band pass filter having different pass bands, whereby said electric signal is separated into a plurality of frequency bands, an averaging means comprising a plurality of averaging circuits connected to said band pass filters in said second band pass filter means for obtaining an average output of said band pass filters in said second band pass filter means, and a means for discriminating at least one band pass filter in which a highest means output thereof exists out of all of said band pass filters, said controlling means for controlling one of said delaying factor and said gain factor of at least one of said amplifying circuits in said amplifying means and said delaying circuit connected o a band pass filter corresponding to the band pass filter in said second band pass filter means in which said mean output thereof shows a highest peak level.

6. A noise reducing device according to claim 1, wherein said original noise wave source is one of a source selected from an internal combustion engine and an electric motor.

7. A noise reducing device according to claim 4, wherein said means for superposing said noise silencing signal with said original signal wave is a speaker which is provided in a space through which said noise wave passes.

8. A noise reducing device according to claim 7, wherein said microphone and speaker are arranged in said space separate from each other with a predetermined length therebetween.

9. A noise reducing device according to claim 7, wherein both of said microphone and speaker are provided in a gas exhausting pipe.

10. A noise reducing device according to claim 7, wherein said microphone is provided in a trunk of an automobile while said speaker is provided in a cabin thereof.

11. A noise reducing device in which noise is silenced by superposing on an original noise wave generated from a noise wave source a noise silencing wave having a different phase from that of said noise wave and generated from a noise silencing device, wherein said noise silencing device comprises:
a delaying means for delaying a phase of said noise wave;
an amplifying means for adjusting a gain of said delayed noise wave;
a frequency selecting means for selecting at least one frequency band having a largest output level from a plurality of frequency bands containing said noise wave;
a parameter memory means for previously storing a plurality of delaying factors, each different from each other, and a plurality of gain factors, each different from each other, said delaying and gain factors being determined with respect to a condition of said noise wave source and connected to said frequency selecting means so that when information about the condition of said noise wave source is output from said frequency selecting means, at least one of said delaying factors and at least one of said gain factors stored in said parameter memory means is selected to control at least one of said delaying means and amplifying means, and said amplifying means generating a noise silencing wave to be superposed on said original noise wave.

12. A noise reducing device according to claim 11, wherein said frequency selecting means comprises:
a band pass filter means having a plurality of band pass filters, each band pass filter having a different band pass to separate said noise wave into said plurality of frequency bands;
an averaging means comprising a plurality of averaging circuits connected to said plurality of band pass filters for obtaining an average output of said band pass filter means; and
a discriminating means for discriminating at least one of said plurality of frequency bands having said largest output level among all of said plurality of averaging circuits and outputting said at least one of said plurality of frequency bands to said parameter memory means.

13. A noise reducing device of claim 11, wherein said frequency selecting means comprises a noise source condition detecting means for detecting a condition of said noise wave source and for outputting a control signal into said parameter memory means to select at lest one of said delay factor and gain factor to adjust at least one of said delaying means and amplifying means, respectively.

14. A noise reducing device according to claim 13, wherein said noise source condition detecting means for detecting said noise wave source conditions comprises a detecting circuit for detecting a rotation number of a rotating body selected from an electric motor and an engine.

15. A noise reducing device according to claim 13, wherein said noise source condition detecting means detects a rotation number of a rotating body in said noise wave source and outputs information to said parameter memory means to select one of a delaying factor and gain factor stored therein in accordance with said detected condition and to control at least one of said delaying means and amplifying means, respectively.

16. A noise reducing device of claim 11, wherein said frequency selecting means comprises:
a noise source condition detecting means for detecting a condition of said noise wave source and for outputting a control signal into said parameter memory means to select at least one of said delay factor and gain factor to adjust at least one of said delaying means and amplifying means, respectively; and a signal generating means for generating a signal corresponding to said noise wave into said delaying means based on said condition of said nose wave source.

17. A noise reducing device according to claim 16, wherein said noise source condition means for detecting said noise wave source conditions comprises a detecting circuit for detecting a rotation number of a rotating body selected from an electric motor and an engine.

18. A noise reducing device according to claim 16, wherein said noise source condition detecting means detects a rotation number of a rotating body in said noise wave source and outputs information to said parameter memory means to select at least one of a delaying factor and gain factor stored therein in accordance with said detected condition and to control at least one of said delaying means, respectively and amplifying means.

19. A noise reducing device according to claim 11, further comprising an analog-to-digital converter for converting said original noise to digital electric signal arranged between said noise wave source and said noise silencing device, and a digital-to-analog converter for converting said digitized delayed noise wave output from said delaying means to actual noise signal arranged between said noise silencing device and said superposing means provided in a space through which said noise wave passes.

20. A noise reducing device according to a claim 19, wherein said analog-to-digital converter is a microphone which converts said original noise wave to a digital signal.

21. A noise reducing device according to claim 20, wherein said means for superposing said noise signal with said original noise wave is a speaker which is provided in a space through which said noise wave passes.

22. A noise reducing device according to claim 20, wherein said microphone and speaker are arranged in said space separate from each other with a predetermined length therebetween.

23. A noise reducing device according to claim 20, wherein both of said microphone and speaker are provided in a gas exhausting pipe.

24. A noise reducing device according to claim 20, wherein said microphone is provided in a trunk of an automobile while said speaker is provided in a cabin thereof.

25. A noise reducing device according to claim 11, wherein said original noise wave is one of a source selected from an internal combustion engine and an electric motor.

26. A noise reducing device according to claim 11, wherein said original noise wave has a peak level which varies.

* * * * *